(12) United States Patent
Zuo et al.

(10) Patent No.: US 12,127,459 B2
(45) Date of Patent: Oct. 22, 2024

(54) DISPLAY WITH SUBPIXELS ARRANGED IN DIVIDED TETRAGON

(71) Applicant: BOE Technology Group Co., Ltd., Beijing (CN)

(72) Inventors: Pengfei Zuo, Beijing (CN); Huameng Liu, Beijing (CN); Shanshan Bai, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 281 days.

(21) Appl. No.: 17/482,976

(22) Filed: Sep. 23, 2021

(65) Prior Publication Data

US 2022/0254841 A1 Aug. 11, 2022

(30) Foreign Application Priority Data

Feb. 9, 2021 (CN) .......................... 202110180456.0

(51) Int. Cl.
*H01L 27/32* (2006.01)
*H10K 59/122* (2023.01)
*H10K 59/35* (2023.01)

(52) U.S. Cl.
CPC ......... *H10K 59/353* (2023.02); *H10K 59/122* (2023.02)

(58) Field of Classification Search
CPC .................................................. H10K 59/353
See application file for complete search history.

(56) References Cited

U.S. PATENT DOCUMENTS

| | | | | |
|---|---|---|---|---|
| 2009/0302331 A1* | 12/2009 | Smith | ................. | G09G 3/3208 257/E33.062 |
| 2019/0302919 A1* | 10/2019 | Clark | ...................... | G06F 3/044 |
| 2020/0357325 A1* | 11/2020 | Zhao | .................... | G09G 3/2003 |
| 2021/0210562 A1* | 7/2021 | Yu | ........................ | H10K 59/353 |
| 2021/0280644 A1* | 9/2021 | Du | ........................ | C23C 14/042 |
| 2021/0335911 A1* | 10/2021 | Zhang | ................. | H10K 59/352 |

FOREIGN PATENT DOCUMENTS

CN 110518051 A * 11/2019 ......... H01L 27/3216

* cited by examiner

*Primary Examiner* — Peter Bradford
(74) *Attorney, Agent, or Firm* — Intellectual Valley Law, P.C.

(57) ABSTRACT

The present disclosure provides a pixel structure, a displaying substrate, a displaying device and a displaying method, wherein the pixel structure includes first sub-pixels, second sub-pixels and third sub-pixels that are located within a first virtual tetragon; the first sub-pixels are located individually adjacent to midpoints of four side edges of the first virtual tetragon; the second sub-pixels are located individually at four interior angles of the first virtual tetragon; and two center lines of the first virtual tetragon delimit the first virtual tetragon into four second virtual tetragons, and the third sub-pixels are located individually at first interior angles within the four second virtual tetragons.

15 Claims, 9 Drawing Sheets

DISPLAY WITH SUBPIXELS ARRANGED IN DIVIDED TETRAGON

The application claims priority to Chinese Patent Application No. 202110180456.0, titled "PIXEL STRUCTURE, DISPLAYING SUBSTRATE, DISPLAYING DEVICE AND DISPLAYING METHOD" and filed to the State Patent Intellectual Property Office on Feb. 9, 2021, the contents of which are incorporated herein by reference in its entirety.

TECHNICAL FIELD

The present disclosure relates to the technical field of displaying, and particularly relates to a pixel structure, a displaying substrate, a displaying device and a displaying method.

BACKGROUND

OLED (Organic Light Emitting Diode) display devices, as compared with traditional liquid-crystal displays, have the advantages such as a low energy consumption, a low production cost, self-illumination, a wide visual angle and a high response speed, are one of the study hot pots of display devices currently, and are applied increasingly extensively in the fields of mobile phones and tablet personal computers.

Currently, in the fabrication processes of OLED display devices, usually a high-precision metal mask (Fine Metal Mask, FMM) is employed, and, for the vapor deposition of an organic material by using a vacuum evaporation process, the openings in the FMM are used to control the area and shape of the organic material to form organic electroluminescent structures.

SUMMARY

The present disclosure provides a pixel structure, a displaying substrate, a displaying device and a displaying method.

The present disclosure discloses a pixel structure, wherein the pixel structure comprises first sub-pixels, second sub-pixels and third sub-pixels that are located within a first virtual tetragon;

the first sub-pixels are located individually adjacent to midpoints of four side edges of the first virtual tetragon;

the second sub-pixels are located individually at four interior angles of the first virtual tetragon; and two center lines of the first virtual tetragon delimit the first virtual tetragon into four second virtual tetragons, and the third sub-pixels are located individually at first interior angles within the four second virtual tetragons, wherein the first interior angles refer to interior angles within the second virtual tetragons that are adjacent to a center point of the first virtual tetragon, and the center lines refer to straight lines connecting midpoints of opposite side edges of the first virtual tetragon.

In an optional implementation, the pixel structure is axially symmetric with respect to anyone of the center lines as an axis.

In an optional implementation, shapes of the first virtual tetragon and the second virtual tetragons are a square, a shape of the first sub-pixels is a rectangle, longer side edges of the first sub-pixels are parallel to the side edges of the first virtual tetragon that are closer to the first sub-pixels, and shapes of facing side edges of the second sub-pixels and the third sub-pixels are complementary.

In an optional implementation, a shape of the second sub-pixels is a concave polygon, and a shape of the third sub-pixels is a convex polygon.

In an optional implementation, within the second virtual tetragons, the second sub-pixels have first facing side edges that face and are parallel to shorter side edges of the first sub-pixels, and a length of the first facing side edges is equal to a length of the shorter side edges of the first sub-pixels.

In an optional implementation, within the second virtual tetragons, a spacing between the first sub-pixels and the second sub-pixels is a first spacing, the third sub-pixels have second facing side edges that face and are parallel to longer side edges of the first sub-pixels, and a length of the second facing side edges is equal to a half of a sum between a length of the longer side edges of the first sub-pixels and the first spacing.

In an optional implementation, four corners of the first sub-pixels are rounded corners.

In an optional implementation, within the second virtual tetragons, all of spacings between the first sub-pixels and the second sub-pixels, spacings between the first sub-pixels and the third sub-pixels and spacings between the second sub-pixels and the third sub-pixels are a first spacing, and the first spacing is greater than or equal to 14 micrometers, and is less than or equal to 24 micrometers.

In an optional implementation, all of spacing between two neighboring instances of the first sub-pixels, spacing between two neighboring instances of the second sub-pixels and spacing between two neighboring instances of the third sub-pixels are a second spacing, and the second spacing is greater than or equal to 4 micrometers, and is less than or equal to 10 micrometers.

In an optional implementation, an area of the first sub-pixels is less than or equal to an area of the second sub-pixels, and an area of the second sub-pixels is less than or equal to an area of the third sub-pixels.

In an optional implementation, the first sub-pixels emit red light, the second sub-pixels emit green light, and the third sub-pixels emit blue light.

In an optional implementation, a pixel defining layer surrounds a periphery of a light-emission region of the first sub-pixels, and an isolating groove or isolating rod is provided on the pixel defining layer.

In an optional implementation, the isolating groove is formed by dry etching or solution etching, and the isolating rod is formed by exposure and development.

In an optional implementation, a ratio between the area of the first sub-pixels, the area of the second sub-pixels and the area of the third sub-pixels is 1:2.8:3.4.

The present disclosure discloses a displaying substrate, wherein the displaying substrate comprises the pixel structure according to any one of the above embodiments.

The present disclosure discloses a displaying device, wherein the displaying device comprises the displaying substrate according to any one of the above embodiments.

The present disclosure discloses a displaying method, wherein the displaying method is applied to the displaying substrate according any one of the above embodiments, the displaying substrate comprises a light-emission region, a no-light-emission region and a transition region located between the light-emission region and the no-light-emission region, the pixel structure according to any one of the above embodiments is provided within the transition region, the pixel structures located within each of the second virtual tetragons form a pixel unit, and the displaying method comprises:

controlling a brightness of the first sub-pixels in the pixel structure, to enable a luminescence center of the pixel unit in the pixel structure to deviate toward the light-emission region.

In an optional implementation, the pixel structure comprises a first pixel unit, a second pixel unit, a third pixel unit and a fourth pixel unit, the first pixel unit is adjacent to the second pixel unit and the third pixel unit, the first pixel unit, the second pixel unit and the third pixel unit display, the fourth pixel unit does not display, and the step of controlling the brightness of the first sub-pixels in the pixel structure, to enable the luminescence center of the pixel unit in the pixel structure to deviate toward the light-emission region comprises:

controlling a first sub-pixel shared by the third pixel unit and the fourth pixel unit to emit light, and a first sub-pixel shared by the second pixel unit and the fourth pixel unit not to emit light, to enable a luminescence center of the second pixel unit to deviate toward the third pixel unit, and the third pixel unit to be adjacent to the light-emission region.

In an optional implementation, the pixel structure comprises a first pixel unit, a second pixel unit, a third pixel unit and a fourth pixel unit, the first pixel unit is adjacent to the second pixel unit and the third pixel unit, the first pixel unit displays, the second pixel unit, the third pixel unit and the fourth pixel unit do not display, and the step of controlling the brightness of the first sub-pixels in the pixel structure, to enable the luminescence center of the pixel unit in the pixel structure to deviate toward the light-emission region comprises:

controlling a first sub-pixel shared by the first pixel unit and the third pixel unit to emit light, and a first sub-pixel shared by the first pixel unit and the second pixel unit not to emit light, to enable a luminescence center of the first pixel unit to deviate toward the third pixel unit, and the third pixel unit to be adjacent to the light-emission region.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present application are provided below.

BRIEF DESCRIPTION OF THE DRAWINGS

In order to more clearly illustrate the technical solutions of the embodiments of the present disclosure, the figures that are required to describe the embodiments of the present disclosure will be briefly introduced below. Apparently, the figures that are described below are embodiments of the present disclosure, and a person skilled in the art can obtain other figures according to these figures without paying creative work.

DETAILED DESCRIPTION

In order to make the above purposes, features and advantages of the present disclosure more apparent and understandable, the present disclosure will be described in further detail below with reference to the drawings and the particular embodiments.

Figure 1:
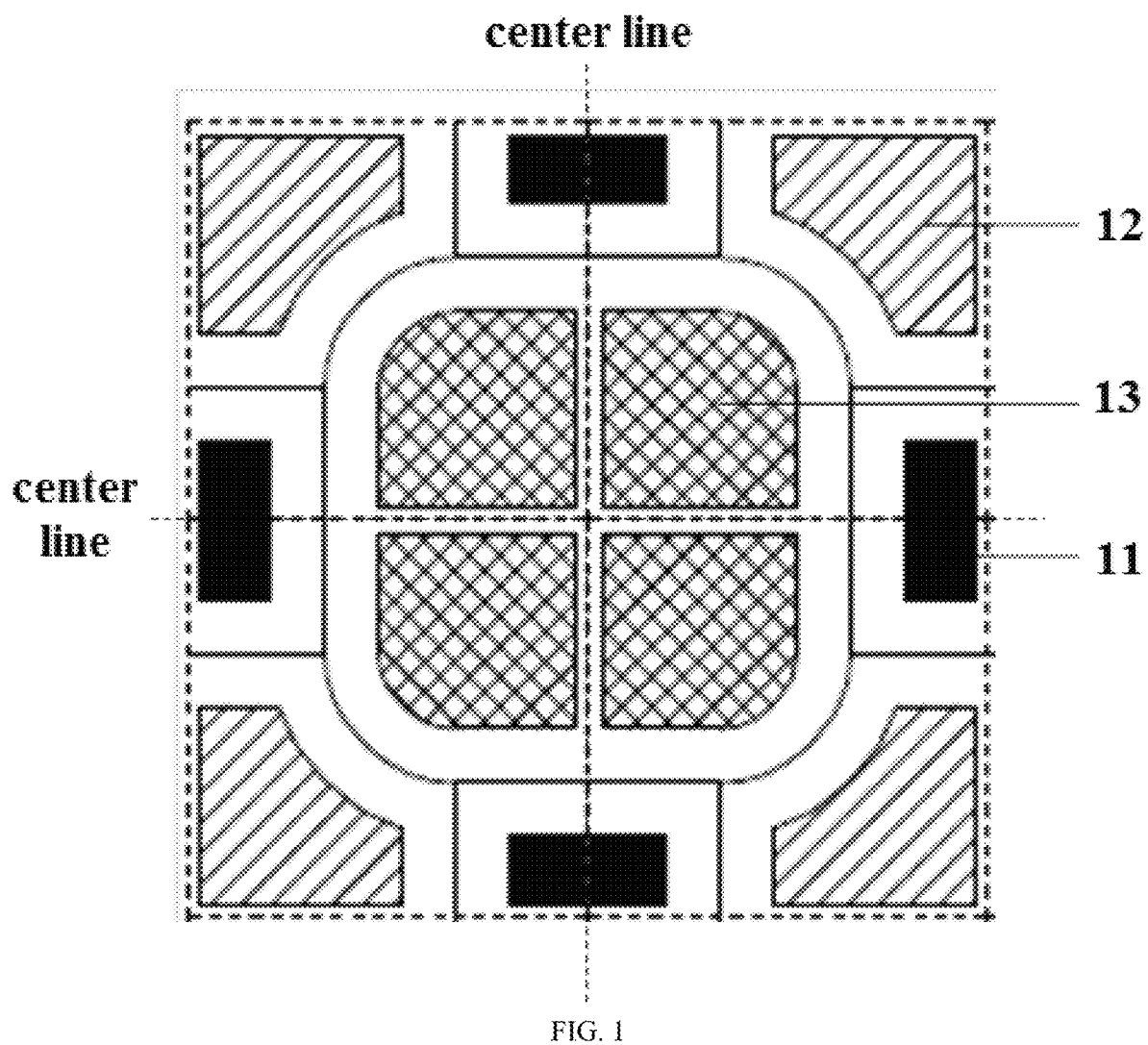
FIG. 1 shows a schematic diagram of the pixel structure according to an embodiment of the present disclosure.

An embodiment of the present disclosure provides a pixel structure. as shown in FIG. 1, the pixel structure comprises first sub-pixels 11, second sub-pixels 12 and third sub-pixels 13 that are located within a first virtual tetragon, the first sub-pixels 11 are located individually adjacent to the midpoints of the four side edges of the first virtual tetragon, and the second sub-pixels 12 are located individually at the four interior angles of the first virtual tetragon.

Two center lines of the first virtual tetragon delimit the first virtual tetragon into four second virtual tetragons, and the third sub-pixels 13 are located individually at the first interior angles within the four second virtual tetragons, wherein the first interior angles refer to interior angles within the second virtual tetragons that are adjacent to a center point of the first virtual tetragon, and the center lines refer to straight lines connecting midpoints of opposite side edges of the first virtual tetragon.

The center point of the first virtual tetragon is also the intersection point of the two center lines.

In the present embodiment, within one pixel structure are provided four first sub-pixels 11, four second sub-pixels 12 and four third sub-pixels 13, all of which are located within the first virtual tetragon.

The pixel structure located within one second virtual tetragon forms one pixel unit, comprising one first sub-pixel 11, one second sub-pixel 12 and one third sub-pixel 13. Therefore, the pixel structure according to the present embodiment is a Real RGB pixel structure. The one first sub-pixel 11 is formed by the halves of two first sub-pixels 11; in other words, two neighboring pixel units share one first sub-pixel 11.

In a particular implementation, the pixel structure may be axially symmetric with respect to one of the center lines as the axis. In other words, two neighboring pixel units may be axially symmetric with respect to a center line.

Figure 8:
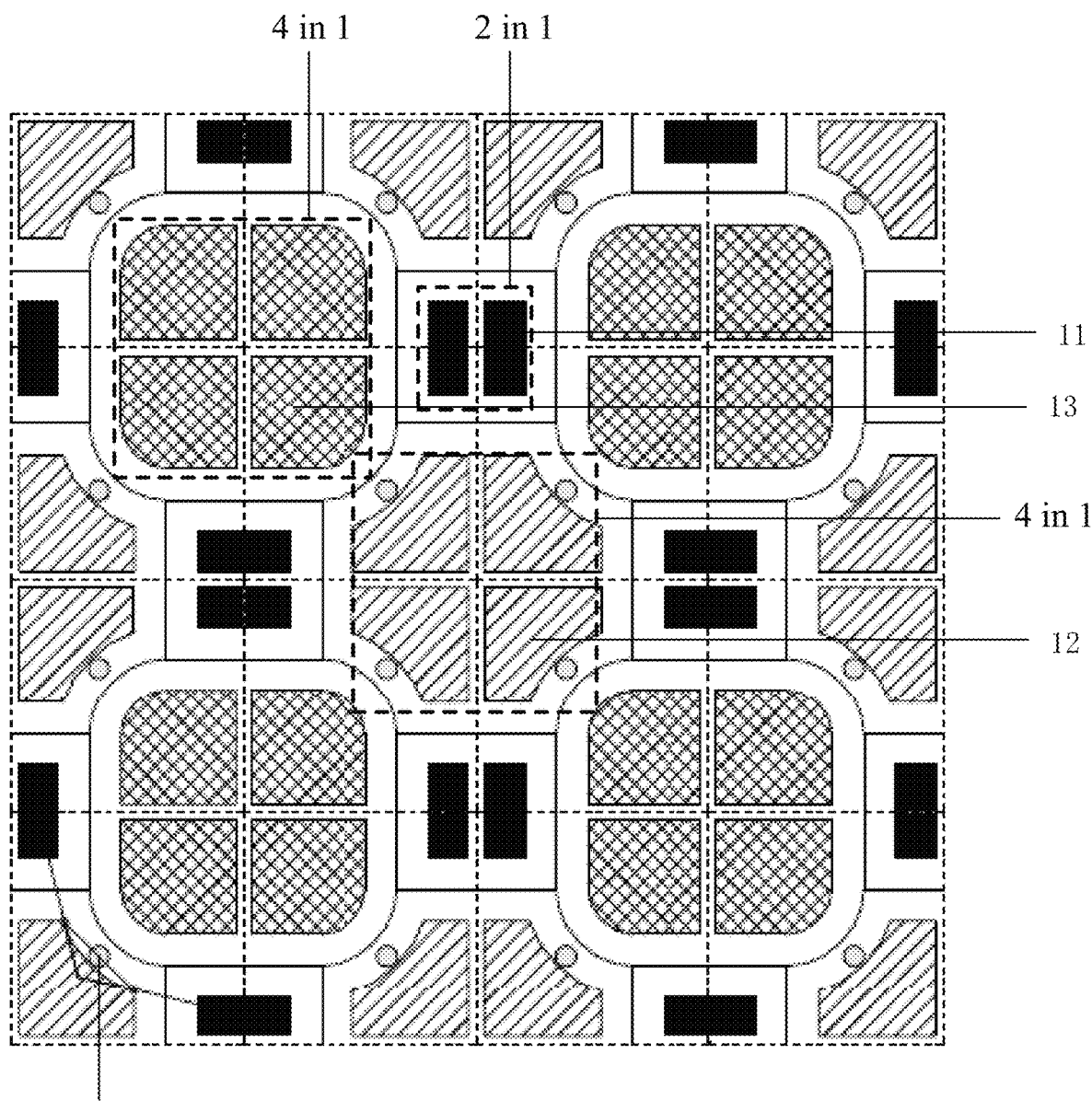
FIG. 8 shows a schematic diagram of the luminescence center of a plurality of pixel units according to an embodiment of the present disclosure.

In the present embodiment, as shown in FIG. 8, when a plurality of the pixel structures are arranged in an array, the sub-pixels of the same type are arranged back to back, the spacings between neighboring sub-pixels of the same type may be less than the spacings between neighboring sub-pixels of different types.

Neighboring sub-pixels of the same type may share one of the openings of a high-precision metal mask for vapor deposition. For example, two neighboring first sub-pixels 11 may employ the design of 2 in 1, four neighboring second sub-pixels 12 may employ the design of 4 in 1, and four neighboring third sub-pixels 13 may employ the design of 4 in 1. In an aspect, that can reduce the spacing between the sub-pixels of the same type, and, in another aspect, that can reduce the position deviation caused by the vapor deposition, which can in turn reduce the weight of the position deviation in the calculation of the opening spacing, and reduce the opening spacing in the high-precision metal mask, thereby increasing the aperture ratio to the largest extent, and facilitating the fabrication of a high-resolution OLED product. In addition, because one opening of the high-precision metal mask corresponds to the vapor deposition of two or four sub-pixels, the quantity of the openings of the high-precision metal mask can be reduced, thereby reducing the difficulty in the fabrication of the high-precision metal mask.

It should be noted that the first virtual tetragon in the pixel structure according to the embodiments of the present disclosure refers to the largest dotted-line block in FIG. 1, and the second virtual tetragons refer to the smaller dotted-line blocks in FIG. 1. The first virtual tetragon comprises four second virtual tetragons. The first virtual tetragon and the second virtual tetragons may be rectangles, and may also be squares, or approximately rectangles and squares, which is not limited herein.

In an optional implementation, the area of the first sub-pixels 11 may be less than or equal to the area of the second sub-pixels 12, and the area of the second sub-pixels 12 may be less than or equal to the area of the third sub-pixels 13.

The first sub-pixels 11 may emit red light R, the second sub-pixels 12 may emit green light G, and the third sub-pixels 13 may emit blue light B.

For example, the ratio between the area of the first sub-pixels 11, the area of the second sub-pixels 12 and the area of the third sub-pixels 13 is 1:2.8:3.4. In other words, the RGB area ratio is 1:2.8:3.4.

With the same RGB area ratio, the same resolution and the same process conditions, the pixel structure according to the present embodiment can increase the pixel aperture ratio to above 30%, while the pixel aperture ratios of conventional pixel structures such as SRGB or Delta are merely 10%-16%.

When the RGB area ratio is 1:2.8:3.4, the pixel aperture ratio of the pixel structure according to the present disclosure can reach 48.6%, while the pixel aperture ratios of conventional pixel structures are merely approximately 20%.

Figure 2:
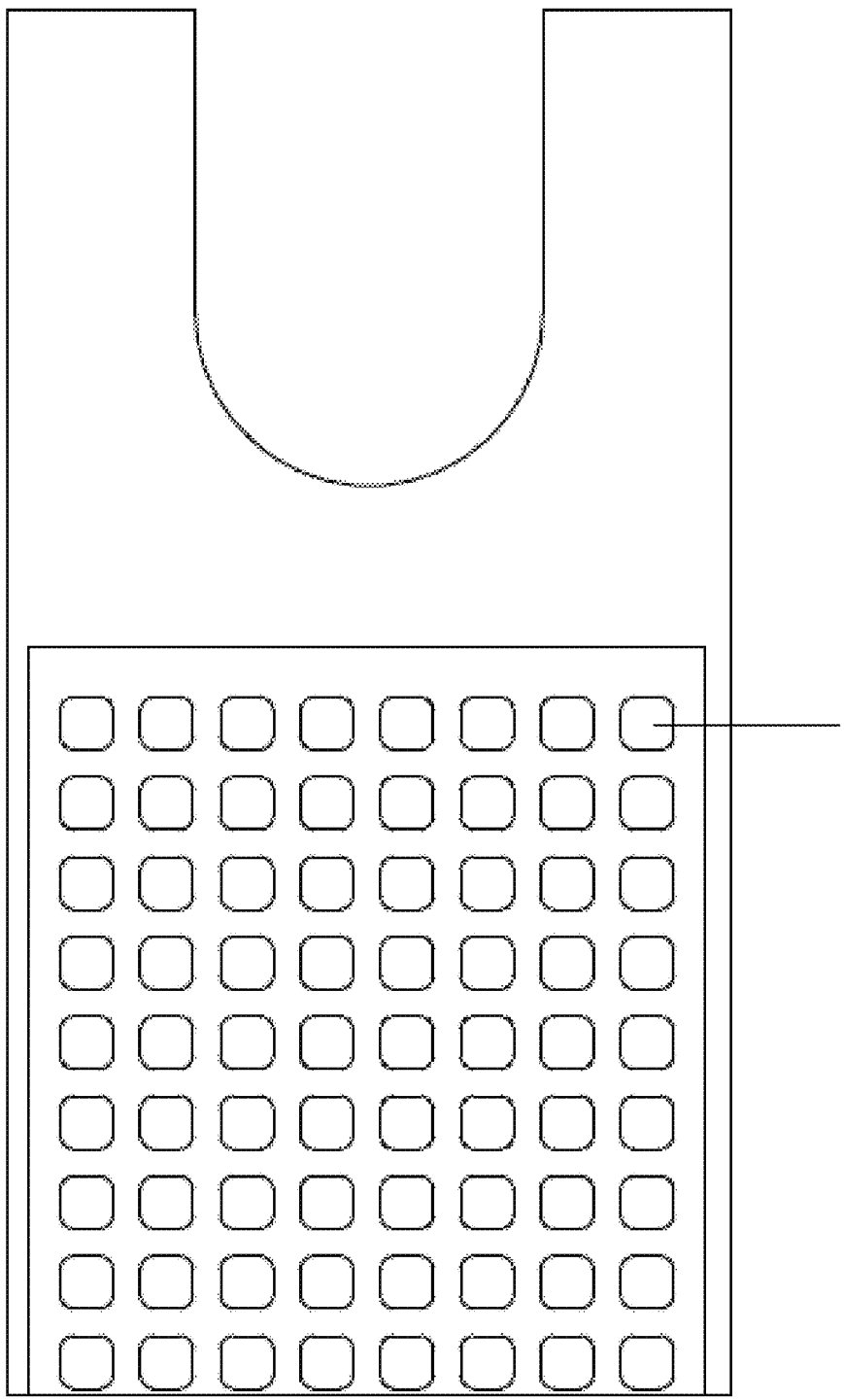
FIG. 2 shows a schematic structural diagram of the high-precision metal mask of the third sub-pixels according to an embodiment of the present disclosure.
Figure 3:
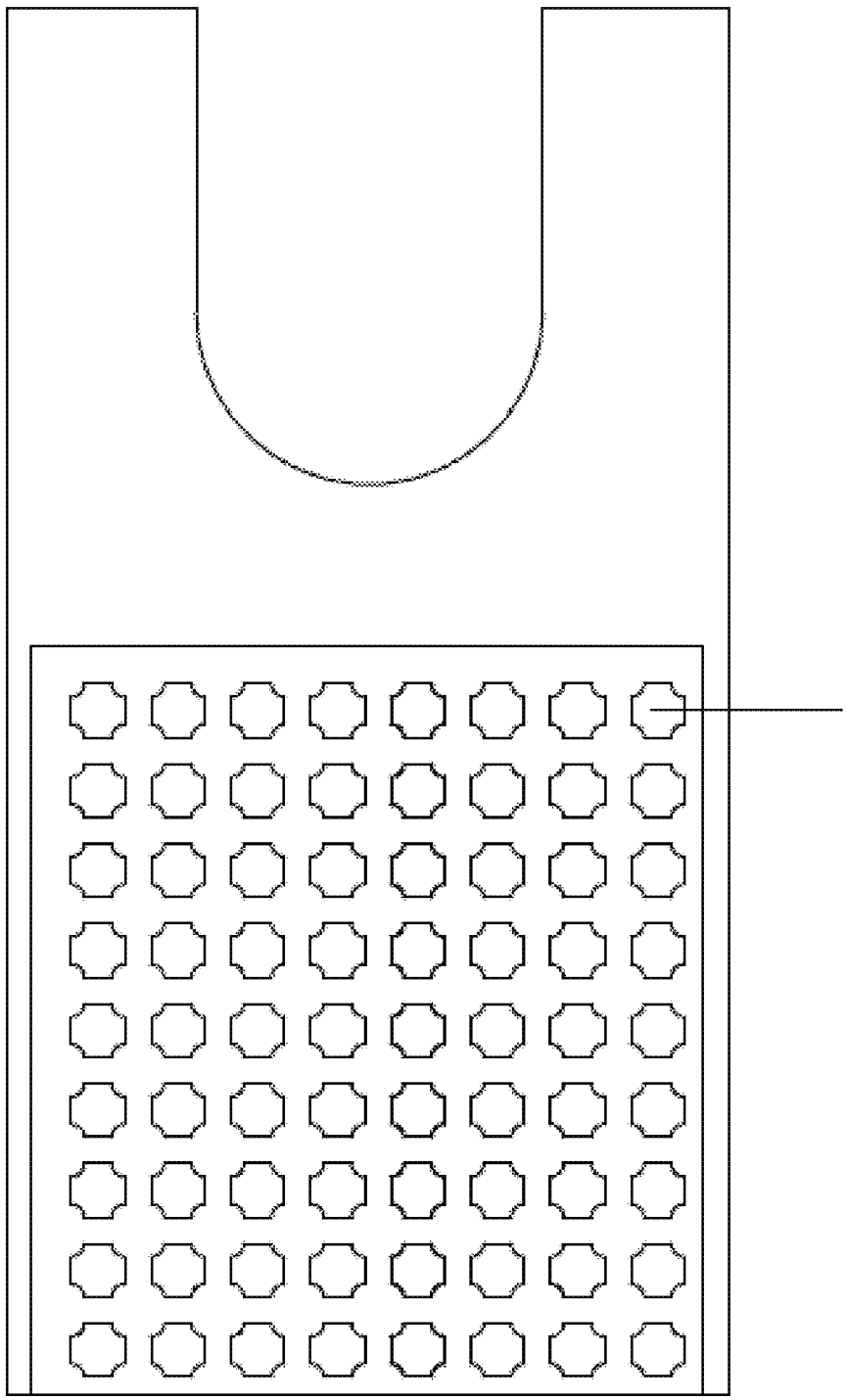
FIG. 3 shows a schematic structural diagram of the high-precision metal mask of the second sub-pixels according to an embodiment of the present disclosure.
Figure 4:
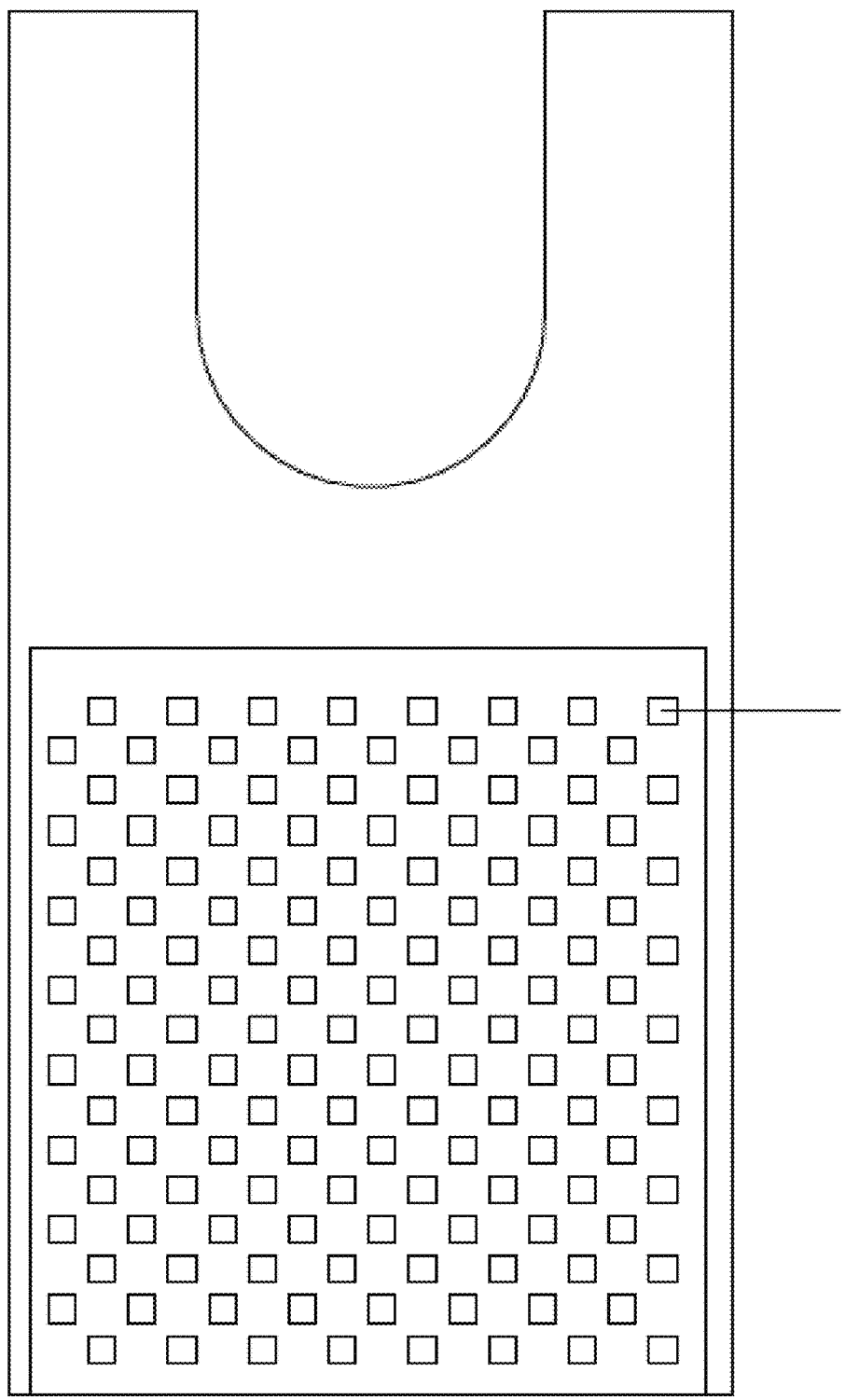
FIG. 4 shows a schematic structural diagram of the high-precision metal mask of the first sub-pixels according to an embodiment of the present disclosure.

By using the pixel structure according to the present disclosure, the high-precision metal mask FMM may be designed as a structure in which one opening corresponds to two or four pixel anodes, thereby reducing the difficulty in fabricating the FMM. FIGS. 2, 3 and 4 show three FMM schematic diagrams used for the pixel structure according to the present embodiment. FIG. 2 is an FMM schematic diagram of the third sub-pixels 13, in which the design is somewhat conventional, and does not affect the net spreading quality. FIG. 3 is an FMM schematic diagram of the second sub-pixels 12, in which the pattern and the shape of the second sub-pixels 12 are relatively complicated, but they have an arrange mode the same as the conventional modes, and do not affect the net spreading quality. FIG. 4 is an FMM schematic diagram of the first sub-pixels 11, in which the FMMs of the first sub-pixels 11, because of the staggered arrangement of the different openings, might have wrinkles. However, because the openings of the first sub-pixels 11 are small, the risk of the generation of wrinkles is small. Especially, the FMM for mobile display products will not have severe wrinkles, which has little influence on the net spreading quality.

Figure 5:
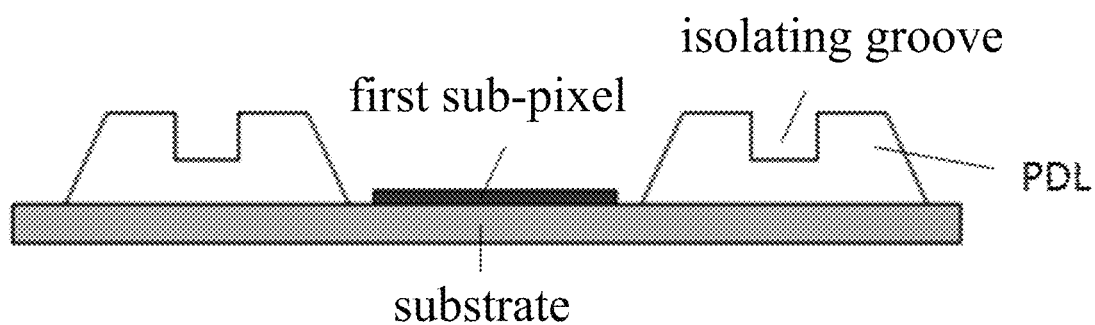
FIG. 5 shows a schematic sectional structural diagram of the isolating grooves provided at the periphery of the first sub-pixels according to an embodiment of the present disclosure.
Figure 6:
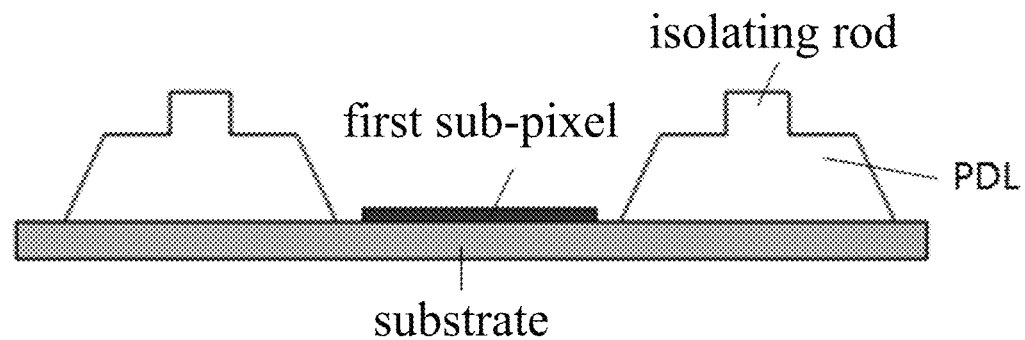
FIG. 6 shows a schematic sectional structural diagram of the isolating rods provided at the periphery of the first sub-pixels according to an embodiment of the present disclosure.

In practical applications, in order to lower the risk that the FMMs of the first sub-pixels 11 have wrinkles, which results in the deviation from the original position of the vapor deposition of the red-light material, and in turn results in cross-color, in the fabrication of the displaying substrate, an isolating groove or isolating rod may be provided on a pixel defining layer PDL surrounding the light-emission region of the first sub-pixels 11. In other words, the isolating groove (as shown in FIG. 5) or isolating rod (as shown in FIG. 6) is provided on the PDL around the first sub-pixels 11 to block the vapor-deposition material. The angle of gradient of the isolating groove relative to the plane where the substrate is located should be as large as possible, and may be approximately a right angle or exceed a right angle. The isolating groove may be formed by dry etching or solution etching, and the isolating rod may be formed by exposure and development.

When a displaying substrate of 400 PPI (Pixels per inch) is fabricated by using the pixel structure according to the present embodiment, the fabrication difficulties of the FMMs of the second sub-pixels 12 and the third sub-pixels 13 are nearly the same as the fabrication difficulties of the FMMs of 200 PPI in conventional pixel structures. The fabrication difficulty of the FMM of the first sub-pixels 11 is slightly higher, but its net-spreading difficulty is merely nearly the same as the fabrication difficulties of the FMMs of 400 PPI in conventional Pentile pixel structures. Therefore, the present disclosure can hugely reduce the limitation on the resolution by the FMM.

In an optional implementation, as shown in FIG. 1, the shapes of the first virtual tetragon and the second virtual tetragons are a square, the shape of the first sub-pixels 11 is a rectangle, and the longer side edges of the first sub-pixels 11 are parallel to the side edges of the first virtual tetragon that are closer to the first sub-pixels 11; in other words, the longer side edges of the first sub-pixels 11 are parallel to the closest side edges of the first virtual tetragon.

The shapes of the facing side edges of the second sub-pixels 12 and the third sub-pixels 13 are complementary. As shown in FIG. 1, the facing side edges of the second sub-pixels 12 and the third sub-pixels 13 are rounded-corner side edges whose shapes are complementary. That can utilize the room sufficiently, and increase the pixel aperture ratio. For example, the shape of the second sub-pixels 12 is a concave polygon, and the shape of the third sub-pixels 13 is a convex polygon.

In the present implementation, the second sub-pixels 12 may emit green light, and the third sub-pixels 13 may emit blue light. Because the luminescent material of the organic luminescent layer of blue light has a lower efficiency, in device design, the area of the blue-color sub-pixels is generally configured to be greater than the area of the green-color sub-pixels. Therefore, by configuring the third sub-pixels 13 to be a convex polygon, and configuring the second sub-pixels 12 to be a concave polygon complementary with the convex polygon, the pixel aperture ratio can be increased to the largest extent, and the life of the display device can be extended.

It should be noted that the rounded-corner side edges of the second sub-pixels 12 or the third sub-pixels 13 (i.e., the facing side edges of the second sub-pixels 12 and the third sub-pixels 13) are not limited to absolute circular arcs. In the present illustrative embodiment, referring to FIG. 7, when the rounded-corner side edge of the second sub-pixel 12 has been enlarged, it can be found that it is formed by two sections of circular arcs and one short straight line, and the rounded-corner side edge of the third sub-pixel 13 is also formed by two sections of circular arcs and one short straight line. In order to reach the maximum aperture ratio, the rounded-corner side edges of the second sub-pixels 12 and the third sub-pixels 13 may be formed by a plurality of sections of circular arcs and a plurality of sections of straight lines, which is not limited by the radian angle of the circular arc or by a single circular arc.

Figure 7:
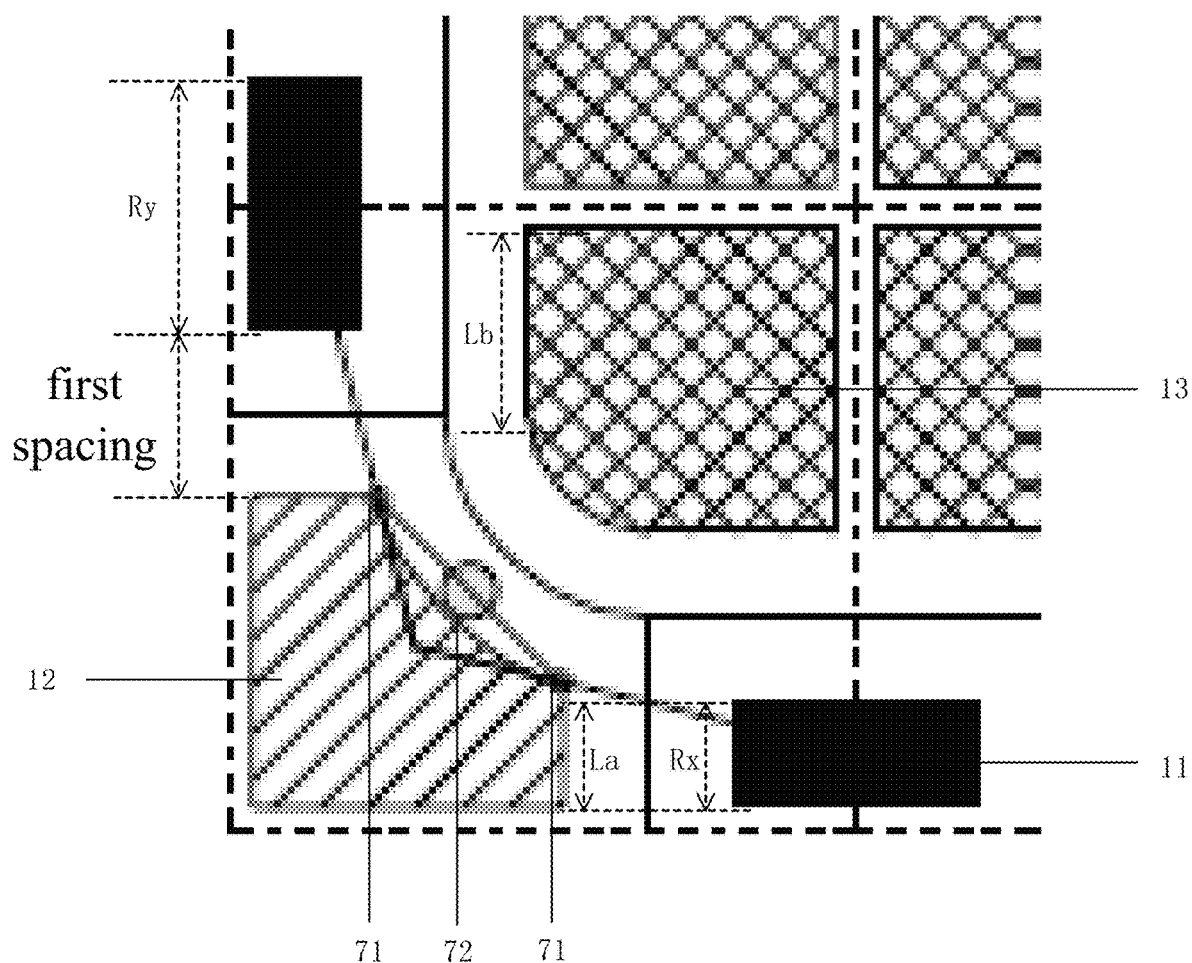
FIG. 7 shows a schematic diagram of the luminescence center of one pixel unit according to an embodiment of the present disclosure.

Optionally, as shown in FIG. 7, within the second virtual tetragons, the second sub-pixels 12 have first facing side edges that face and are parallel to the shorter side edges of the first sub-pixels 11, and the length La of the first facing side edges is equal to the length Rx of the shorter side edges of the first sub-pixels 11.

Optionally, referring to FIG. 7, within the second virtual tetragons, the spacing between the first sub-pixels 11 and the second sub-pixels 12 is a first spacing, the third sub-pixels 13 have second facing side edges that face and are parallel to the longer side edges of the first sub-pixels 11, and the length Lb of the second facing side edges is equal to a half of the sum between the length Ry of the longer side edges of the first sub-pixels 11 and the first spacing.

Referring to FIG. 7, the sum between ½ of the length Ry of the longer side edges of the first sub-pixels 11 and ½ of the first spacing (Pixel Pitch) is equal to the length Lb of the second facing side edges of the third sub-pixels 13; in other words, Ry/2+Pixel Pitch/2=Lb.

In an optional implementation, the four corners of the first sub-pixels 11 may be rounded corners. Because, in the FMM of the first sub-pixels 11, the opening regions are arranged in stagger, as shown in FIG. 4, the trend of the deformation during the net spreading is lengthening in the longitudinal direction and shortening in the transverse direction, and the four corners have a trend of stretching, and easily change from the rectangle to a star (obliquely 45°) shape. Therefore, configuring the four corners of the first sub-pixels 11 into rounded corners can prevent excessively serious expansion and contraction.

In an optional implementation, within the second virtual tetragons, all of the spacings between the first sub-pixels 11 and the second sub-pixels 12, the spacings between the first sub-pixels 11 and the third sub-pixels 13 and the spacings between the second sub-pixels 12 and the third sub-pixels 13 are a first spacing, and the first spacing is greater than or equal to 14 micrometers, and is less than or equal to 24 micrometers. For example, the first spacing may be 16 μm.

Because the FMM of the second sub-pixels 12 is of a cross-star shape, in such a design, when stretched, the rounded corners in the middle merely have the trend of rotation, and have little trend of displacement. Therefore, the spacing between the second sub-pixels 12 and the first sub-pixels 11 can be reduced properly, to further increase the aperture ratio.

In an optional implementation, all of the spacing between two neighboring first sub-pixels 11, the spacing between two neighboring second sub-pixels 12 and the spacing between two neighboring third sub-pixels 13 are a second spacing, and the second spacing is greater than or equal to 4 micrometers, and is less than or equal to 10 micrometers. For example, the second spacing may be 4 μm.

In the present embodiment, the spacings between the sub-pixels of different colors may be the first spacing, the spacings between the sub-pixels of the same color may be the second spacing, wherein the second spacing is less than the first spacing.

It should be noted that the spacing between the sub-pixels according to the embodiments of the present disclosure refers to the minimum spacing between two neighboring sub-pixels, i.e., the shortest distance between the edges of two neighboring sub-pixels.

In the present embodiment, the particular shapes, positions and relative position relations of the sub-pixels may be configured according to demands. In the practical processes, the limitations by the process conditions or other factors might also cause some deviations. Therefore, the shapes, positions and relative position relations of the sub-pixels are merely required to substantially satisfy the above conditions, all of the products of which fall within the scope of the pixel structure according to the embodiments of the present disclosure.

An embodiment of the present disclosure further provides a displaying substrate, wherein the displaying substrate comprises the pixel structure according to any one of the above embodiments.

In a particular implementation, the displaying substrate may comprise a plurality of the pixel structures arranged in an array, as shown in FIG. 8.

An embodiment of the present disclosure further provides a displaying device, wherein the displaying device comprises the displaying substrate according to any one of the above embodiments.

It should be noted that the displaying device according to the present embodiment may be any products or components that have the function of 2D or 3D displaying, such as a display panel, an electronic paper, a mobile phone, a tablet personal computer, a TV set, a notebook computer, a digital photo frame and a navigator.

An embodiment of the present disclosure further provides a displaying method, wherein the displaying method is applied to the displaying substrate according any one of the above embodiments, the displaying substrate comprises a light-emission region, a no-light-emission region and a transition region located between the light-emission region and the no-light-emission region, the pixel structure according to any one of the above embodiments is provided within the transition region, the pixel structures located within each of the second virtual tetragons form a pixel unit, and the displaying method comprises: controlling the brightness of the first sub-pixels 11 in the pixel structure, to enable a luminescence center of the pixel unit in the pixel structure to deviate toward the light-emission region.

Because the point of the luminescence center of the pixel unit is located at the position adjacent to the second sub-pixel 12 at ⅓ of the connecting line between the center points of the first sub-pixel 11 and the second sub-pixel 12, FIG. 7 shows a schematic diagram of the luminescence center of a pixel unit according to the present illustrative embodiment. Because, in the configuration of the present embodiment, the length of the first facing side edges of the second sub-pixel 12 and the length of the shorter side edges of the first sub-pixel 11 are equal, and because of the shape of the concave polygon of the second sub-pixel 12, the center point of the second sub-pixel 12 is definitely lower than the center point of the first sub-pixel 11, the position adjacent to the second sub-pixel 12 at ⅓ of the connecting line between the center points of the first sub-pixel 11 and the second sub-pixel 12 is shown by the small black hollow circle 71 in FIG. 7. Additionally, because each of the pixel units comprises two halves of the first sub-pixel 11, the midpoint of the connecting line between the two small black hollow circles 71 is the actual luminescence-center point 72 of the single pixel unit, as shown by the grey circle in FIG. 7. The luminescence-center array of a plurality of the pixel units is illustratively shown in FIG. 8. The luminescence-center point of the pixel unit of the present illustrative embodiment is closer to the geometric center point of the pixel unit, which can improve the displaying granular sensation.

In the controlling on the displaying substrate for displaying, regarding different boundaries between the light-emission region and the no-light-emission region, the first sub-pixels 11 may be controlled to emit light or not to emit light, to enable the luminescence-center point of the pixel unit to deviate toward the side of the light-emission region, which can reduce the generation of granular sensation.

Figure 9:
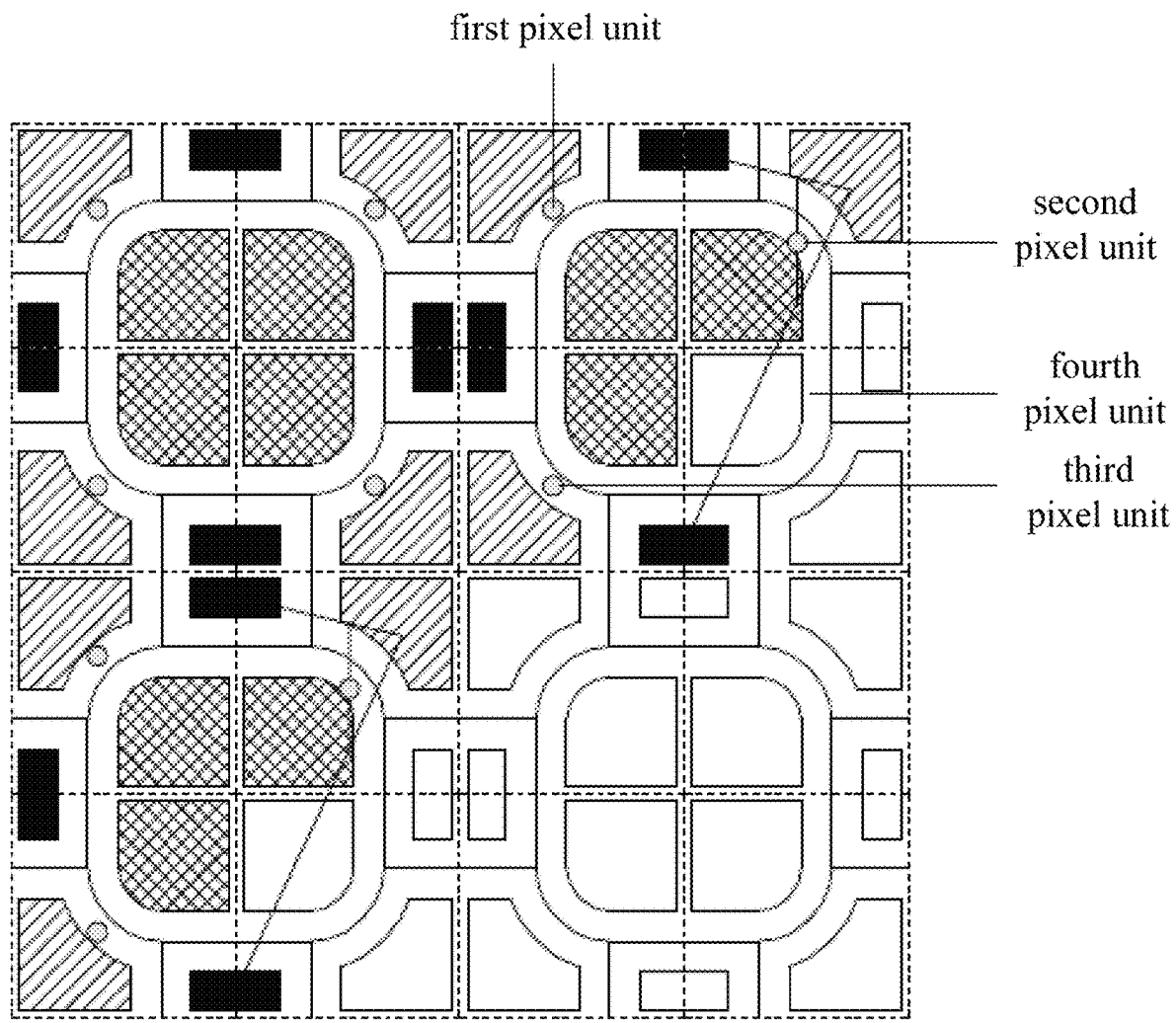
FIG. 9 shows a schematic diagram of the luminescence center of the pixels whose slanting edge is less than or equal to forty-five degrees according to an embodiment of the present disclosure.

In an optional implementation, as shown in FIG. 9, the pixel structure comprises a first pixel unit, a second pixel unit, a third pixel unit and a fourth pixel unit, the first pixel unit is adjacent to the second pixel unit and the third pixel unit, the first pixel unit, the second pixel unit and the third pixel unit display, the fourth pixel unit does not display, and the step of controlling the brightness of the first sub-pixels 11 in the pixel structure, to enable the luminescence center of the pixel unit in the pixel structure to deviate toward the light-emission region comprises:

controlling a first sub-pixel 11 shared by the third pixel unit and the fourth pixel unit to emit light, and a first sub-pixel 11 shared by the second pixel unit and the fourth pixel unit not to emit light, to enable a luminescence center of the second pixel unit to deviate toward the third pixel unit, and the third pixel unit to be adjacent to the light-emission region.

Figure 10:
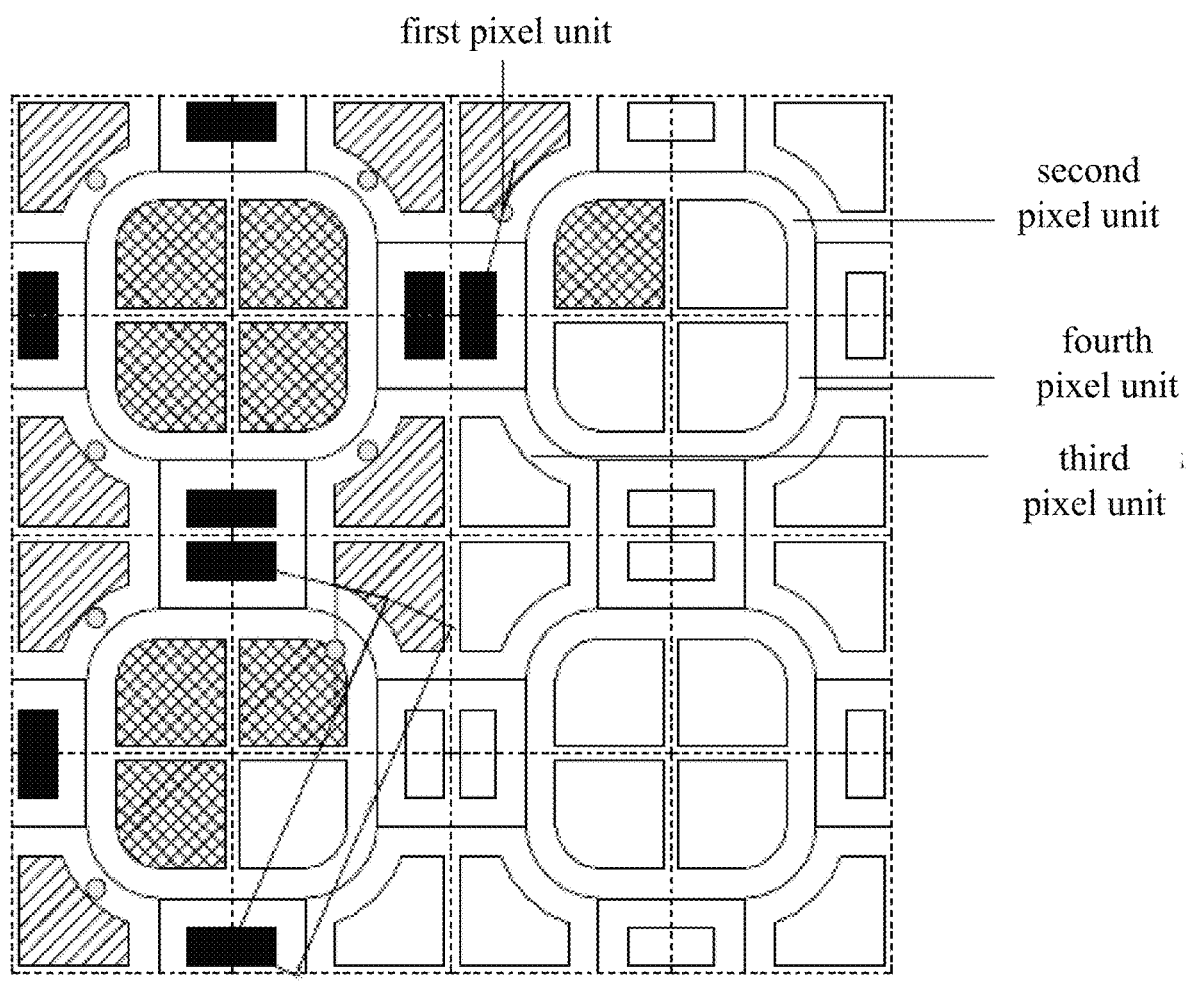
FIG. 10 shows a schematic diagram of the luminescence center of the pixels whose slanting edge is greater than forty-five degrees according to an embodiment of the present disclosure.

In an optional implementation, as shown in FIG. 10, the pixel structure comprises a first pixel unit, a second pixel unit, a third pixel unit and a fourth pixel unit, the first pixel unit is adjacent to the second pixel unit and the third pixel unit, the first pixel unit displays, the second pixel unit, the third pixel unit and the fourth pixel unit do not display, and the step of controlling the brightness of the first sub-pixels 11 in the pixel structure, to enable the luminescence center of the pixel unit in the pixel structure to deviate toward the light-emission region comprises:

controlling a first sub-pixel 11 shared by the first pixel unit and the third pixel unit to emit light, and a first sub-pixel 11 shared by the first pixel unit and the second pixel unit not to emit light, to enable a luminescence center of the first pixel unit to deviate toward the third pixel unit, and the third pixel unit to be adjacent to the light-emission region.

As shown in FIG. 9, when a 45-degree slanting edge is to be displayed, if all of the pixel units in the top left direction, i.e., the first pixel unit, the second pixel unit and the third pixel unit, emit white light, and th pixel unit in the bottom right direction, i.e., the fourth pixel unit, does not emit light, then it may be controlled that a first sub-pixel 11 shared by the third pixel unit and the fourth pixel unit emit light, and a first sub-pixel 11 shared by the second pixel unit and the fourth pixel unit do not emit light, which does not only ensure the RGB color ratio, but also causes the position of the luminescence center to move toward the side of the third pixel unit in the bottom left direction, i.e., moving toward the side of the light-emission region, thereby improving the granular sensation of the edge and the color-edge phenomenon. The slanting edges in the other directions are controlled in the same manner.

In the actual state of light emission, the edge might not be ideal 45 degrees, as that of the example in FIG. 9, and accordingly the controlling on the first sub-pixels 11 may be modified according to the controlling on the pixel circuits. For example, regarding light emission less than or equal to forty-five degrees, the horizontal first sub-pixels 11 may be used for compensation, and, regarding light emission greater than or equal to forty-five degrees, the vertical second sub-pixels 12 may be used for compensation (as shown in FIG. 10). As shown in FIG. 10, regarding the case in which the boundary is greater than forty-five degrees, the luminescence center of the edge pixel units may be deviated toward the side of the third pixel unit in the bottom left direction, which can also improve the granular sensation of the displaying and the color-edge phenomenon.

The present embodiment provides a pixel structure, a displaying substrate, a displaying device and a displaying method, wherein the pixel structure comprises first sub-pixels 11, second sub-pixels 12 and third sub-pixels 13 that are located within a first virtual tetragon; the first sub-pixels 11 are located individually adjacent to the midpoints of the four side edges of the first virtual tetragon; the second sub-pixels 12 are located individually at the four interior angles of the first virtual tetragon; and two center lines of the first virtual tetragon delimit the first virtual tetragon into four second virtual tetragons, the third sub-pixels 13 are located individually at the first interior angles within the four second virtual tetragons, wherein the first interior angles refer to interior angles within the second virtual tetragons that are adjacent to a center point of the first virtual tetragon, and the center lines refer to straight lines connecting midpoints of opposite side edges of the first virtual tetragon. By using the pixel structure according to the present disclosure, neighboring sub-pixels of the same type can share one of the openings of a high-precision metal mask for vapor deposition. In an aspect, that can reduce the spacing between the sub-pixels of the same color, and, in another aspect, that can reduce the position deviation caused by the vapor deposition, and can in turn reduce the opening spacing in the high-precision metal mask, thereby increasing the pixel aperture ratio to the largest extent, and facilitating the fabrication of a high-resolution OLED product. In addition, because one opening of the high-precision metal mask corresponds to the vapor deposition of two or four sub-pixels, the quantity of the openings of the high-precision metal mask can be reduced, thereby reducing the difficulty in the fabrication of the high-precision metal mask.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . ." does not exclude additional same element in the process, method, article or device comprising the element.

The pixel structure, the displaying substrate, the displaying device and the displaying method according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

The invention claimed is:

1. A pixel structure, wherein the pixel structure comprises first sub-pixels, second sub-pixels and third sub-pixels that are located within a first virtual tetragon;
the first sub-pixels are located individually adjacent to midpoints of four side edges of the first virtual tetragon;
the second sub-pixels are located individually at four interior angles of the first virtual tetragon;
two center lines of the first virtual tetragon delimit the first virtual tetragon into four second virtual tetragons, and the third sub-pixels are located individually at first interior angles within the four second virtual tetragons, wherein the first interior angles refer to interior angles within the second virtual tetragons that are adjacent to a center point of the first virtual tetragon, and the center lines refer to straight lines connecting midpoints of opposite side edges of the first virtual tetragon; and
shapes of the first virtual tetragon and the second virtual tetragons are a square, a shape of the first sub-pixels is a rectangle, longer side edges of the first sub-pixels are parallel to the side edges of the first virtual tetragon that are closer to the first sub-pixels, and shapes of facing side edges of the second sub-pixels and the third sub-pixels are complementary, wherein the facing side edges of the second sub-pixels and the third sub-pixels are rounded-corner side edges whose shapes are complementary.

2. The pixel structure according to claim 1, wherein the pixel structure is axially symmetric with respect to anyone of the center lines as an axis.

3. The pixel structure according to claim 1, wherein a shape of the second sub-pixels is a concave polygon, and a shape of the third sub-pixels is a convex polygon.

4. The pixel structure according to claim 3, wherein within the second virtual tetragons, the second sub-pixels have first facing side edges that face and are parallel to shorter side edges of the first sub-pixels, and a length of the first facing side edges is equal to a length of the shorter side edges of the first sub-pixels.

5. The pixel structure according to claim 3, wherein within the second virtual tetragons, a spacing between the first sub-pixels and the second sub-pixels is a first spacing, the third sub-pixels have second facing side edges that face and are parallel to longer side edges of the first sub-pixels, and a length of each of the second facing side edges is equal to half a sum of a length of one longer side edge of the first sub-pixels and the first spacing.

6. The pixel structure according to claim 1, wherein four corners of the first sub-pixels are rounded corners.

7. The pixel structure according to claim 1, wherein within the second virtual tetragons, all of spacings between the first sub-pixels and the second sub-pixels, spacings between the first sub-pixels and the third sub-pixels and spacings between the second sub-pixels and the third sub-pixels are a first spacing, and the first spacing is greater than or equal to 14 micrometers, and is less than or equal to 24 micrometers.

8. The pixel structure according to claim 1, wherein all of spacing between two neighboring instances of the first sub-pixels, spacing between two neighboring instances of the second sub-pixels and spacing between two neighboring instances of the third sub-pixels are a second spacing, and the second spacing is greater than or equal to 4 micrometers, and is less than or equal to 10 micrometers.

9. The pixel structure according to claim 1, wherein an area of the first sub-pixels is less than or equal to an area of the second sub-pixels, and an area of the second sub-pixels is less than or equal to an area of the third sub-pixels.

10. The pixel structure according to claim 9, wherein the first sub-pixels emit red light, the second sub-pixels emit green light, and the third sub-pixels emit blue light.

11. The pixel structure according to claim 10, wherein a pixel defining layer surrounds a periphery of a light-emission region of the first sub-pixels, and an isolating groove or isolating rod is provided on the pixel defining layer.

12. The pixel structure according to claim 11, wherein the isolating groove is formed by dry etching or solution etching, and the isolating rod is formed by exposure and development.

13. The pixel structure according to claim 9, wherein a ratio between the area of the first sub-pixels, the area of the second sub-pixels and the area of the third sub-pixels is 1:2.8:3.4.

14. A displaying substrate, wherein the displaying substrate comprises the pixel structure according to claim 1.

15. A displaying device, wherein the displaying device comprises the displaying substrate according to claim 14.

* * * * *